(12) United States Patent
Lee

(10) Patent No.: US 7,126,747 B2
(45) Date of Patent: Oct. 24, 2006

(54) HYBRID OPTICAL AMPLIFIER COUPLING RAMAN FIBER AMPLIFIER AND SEMICONDUCTOR OPTICAL AMPLIFIER

(76) Inventor: Donghan Lee, 12-402 KIT Apartment, 236-2bunji Gajung-dong, Yuscong-gu, Daejeon-si, 305-350 (KR)

(*) Notice: Subject to any disclaimer, the term of this patent is extended or adjusted under 35 U.S.C. 154(b) by 221 days.

(21) Appl. No.: 10/282,409

(22) Filed: Oct. 29, 2002

(65) Prior Publication Data
US 2003/0090779 A1    May 15, 2003

(30) Foreign Application Priority Data
Oct. 29, 2001    (KR)    .................... 10-2001-0066645

(51) Int. Cl.
*H01S 3/00*    (2006.01)
(52) U.S. Cl. .................................. 359/334
(58) Field of Classification Search ................ 359/334
See application file for complete search history.

(56) References Cited

U.S. PATENT DOCUMENTS

| | | | |
|---|---|---|---|
| 6,490,077 B1 * | 12/2002 | Conradi | 359/334 |
| 6,501,870 B1 * | 12/2002 | Banerjee et al. | 385/24 |
| 6,510,000 B1 * | 1/2003 | Onaka et al. | 359/334 |
| 6,751,013 B1 * | 6/2004 | Wu | 359/337 |
| 6,778,320 B1 * | 8/2004 | Traynor | 359/334 |
| 2002/0067540 A1 * | 6/2002 | Delprat et al. | 359/344 |
| 2002/0163710 A1 * | 11/2002 | Ellis | 359/333 |
| 2002/0191277 A1 * | 12/2002 | Chen et al. | 359/341.4 |
| 2004/0207907 A1 * | 10/2004 | Bayart et al. | 359/334 |

OTHER PUBLICATIONS

Schaafsma et al. Comparison of Conventional and Gain-Clamped Semiconductor Optical Amplfiers for Wavelength-Division-Multiplexed Transmission Systems. Journal of Lightwave Technology. vol. 18. No. 7. Jul. 2000. pp. 922-925.*
Weik, Martin H. Fiber Optics Standard Dictionary. 3rd Edition. Chapman Hall. 1997. pp. 491-492 and pp. 820-821.*
Silfvast, William. Laser Fundamentals. 2nd Edition. Cambridge University Press. 2004. pp. 206-207.*
Merriam Webster Online Thesaurus. http://www.m-w.com. 2004.*

* cited by examiner

*Primary Examiner*—Deandra M. Hughes
(74) *Attorney, Agent, or Firm*—Scully, Scott, Murphy & Presser, P.C.

(57) ABSTRACT

The present invention discloses a hybrid optical amplifier coupling a Raman fiber amplifier and a semiconductor optical amplifier, comprising: a laser diode generating and radiating a laser light for a Raman optical amplification; a wavelength division multiplexer passing an incident signal light and radiating a laser light radiated from the laser diode in a reverse direction of the incident signal light; and a gain clamped semiconductor optical amplifier amplifying an optical signal light radiated from the wavelength division multiplexer.

36 Claims, 4 Drawing Sheets

HYBRID OPTICAL AMPLIFIER COUPLING RAMAN FIBER AMPLIFIER AND SEMICONDUCTOR OPTICAL AMPLIFIER

BACKGROUND OF THE INVENTION

1. Field of the Invention

The present invention relates to an optical amplifier for optical communications, and more particularly, to a hybrid optical amplifier that couples a Raman fiber amplifier and a semiconductor optical amplifier to perfectly operate in WDM optical transmission systems. The hybrid optical amplifier uses both a gain clamped semiconductor optical amplifier and a Raman fiber amplifier, so that a sufficiently high gain and a sufficiently low noise figure are secured. In addition, the hybrid optical amplifier works perfect in WDM optical networks, in which the number of channels are dynamically changed by an add/drop of channels or the like. The semiconductor optical amplifier and Raman fiber amplifier are packaged in a small size without using an optical fiber, so that the hybrid optical amplifier is convenient to use and low in cost.

2. Description of Related Art

To cope with a recently rapidly increasing optical communication capacity, developments for high-capacity main communication networks and connection of an optical fiber to a subscriber level are actively being performed. In such a system, an optical amplifier is a key device to compensate a loss incurred, for example, by a long distance transmission or/and the insertion of parts.

An erbium-doped fiber amplifier (hereinafter referred to as simply "EDFA") is usually used as the optical amplifier, and researches to develop new optical amplifiers which are better in size, available bands, and cost are actively pursued. Candidates for such an optical amplifier include a semiconductor optical amplifier (hereinafter referred to as simply "SOA"), a Raman fiber amplifier (RFA), and a hybrid optical amplifier that consists of both an SOA and Raman fiber amplifier.

SOA has advantages that the size is very small, the power consumption is low, the cost can be very low, and an amplification band can be easily adjusted. However, SOA has also disadvantages that the power output is low, the noise figure is worse than typical EDFAS, and the cross-talk between channels is serious.

Researches to use SOA's in a metro-WDM system which is in great demand are restrictively performed. However, it is not widely accepted because it has difficulties to use due to a relatively high noise figure and an low output power in order to avoid significant cross-talks between channels.

Meanwhile, RFA has an advantage that it is easy to adjust an amplification band just by varying a pump laser wavelength using an transmission optical fiber as a gain medium. In particular, when it is coupled to the existing EDFA, a longer distance transmission is possible since a gain is increased and an effective noise figure is lowered. However, when RFA is not used together with other amplifiers such as an EDFA, but is used alone, its use is actually very difficult because a pump light of about 1 W should be inseterted into a single mode optical fiber in order to get a sufficient gain, i.e., more than 20 dB.

A hybrid type optical amplifier has been recently developed that couples an SOA and an RFA in order to solve problems of the previous amplifiers. FIG. 2 is a block diagram illustrating the hybrid type optical amplifier coupling the SOA and the RFA.

As shown in FIG. 2, a signal light incident through a transmission optical fiber 110 is amplified due to a simulated Raman scattering incurred in a transmission optical fiber by pumping laser diodes (LD) 121 having a high output proceeding in a reverse direction through a wavelength division multiplexer 122. The signal amplified by the reverse pumping Raman fiber amplifier passes through a first isolator 130 and is incident to the SOA 140 and then proceeds tens of kilometers. Thereafter, the same operation is repeated in the next step.

Since the signal incident to the SOA 140 is amplified beforehand with an addition of negligible noise the magnitude of noise added in the SOA 140 is relatively small, whereby an effective noise figure is lowered. In such a way, the gain of the SOA 140 is increased and the noise figure is lowered, so that the hybrid type optical amplifier can operate as an optical amplifier of a high performance. In this case, since the SOA 140 is made of a semiconductor chip and Raman pumping laser diode LD 122 is made of another semiconductor chip, the cost of the system can be sufficiently low.

However, the conventional art described above is hard to properly perform a WDM signal amplification. This is because when several channels of different wavelengths are amplified, since gain characteristics are homogeneous and gain dynamics are fast about 1 ns, a cross-talk phenomenon that a total gain value is varied according to an input signal variation of one channel, so that gain values of other channels are varied. As a result, a sufficiently small input signal in only a region where the gain saturation is not serious should be used, in order to avoid the cross-talk problem. This system cannot be used in WDM networks in which dynamic add/drops are frequent.

On the other hand, to remove a cross-talk from the conventional SOAs of the previous art, as shown in FIG. 3, a type of gain-clamped SOA (GCSOA) 220 having a clamped gain regardless of a power of an input optical signal are reported. Another type of GCSOA clamping a gain by providing a feedback in a direction of a light axis and a GCSOA, known as LOA, clamping a gain by providing a feedback in a perpendicular direction to a light axis has been commercially available very recently. The LOA is excellent in gain clamping characteristic and shows no relaxation oscillation to 20 GHz. In this case, since there is no cross-talk and the gain per channel is not varied even though there is an add/drop of channels, the GCSOAs can be used in the WDM networks of FIG. 1. The GCSOA (LOA) is much more excellent in gain clamping characteristic than the gain clamped EDFA.

However, like the conventional SOA, the GCSOA, including LOA, is also low in output and is high in noise figure and so can be used only for transmissions of short distance.

Furthermore, the hybrid type optical amplifier of FIG. 2 uses the SOA pigtailed with an optica fiber and a laser diode also pigtailed with an optica fiber. In this case, there is a limitation in lowering a cost because it is a difficult to package the semiconductor chip into an optical fiber and most of the device cost comes from the packaging. Besides, since respective parts are coupled by an optical fiber which is not short, there is a problem in that a total size of the hybrid optical amplifier becomes large.

SUMMARY OF THE INVENTION

It is an object of the present invention to provide a hybrid optical amplifier coupling a Raman fiber amplifier and a semiconductor optical amplifier which has a sufficient gain, a low noise figure and an excellent gain clamping characteristic suitable for WDM networks.

It is another object of the present invention to provide the hybrid optical amplifier in a small package to lower a manufacturing cost and still to have good characteristics in gain and noise figure. The amplifier is very effective to extend the gain bandwidths, as well.

In order to achieve the above object, the preferred embodiments of the present invention provide a hybrid optical amplifier coupling a Raman fiber amplifier and a gain clamped semiconductor optical amplifier, comprising: a laser diode generating and radiating a laser light for a Raman optical amplification; a wavelength division multiplexer passing an incident signal light and radiating a laser light radiated from the laser diode in a reverse direction of the incident signal light; and a gain clamped semiconductor optical amplifier amplifying an optical signal radiated from the wavelength division multiplexer.

The present invention further provides a hybrid optical amplifier coupling a Raman fiber amplifier and a semiconductor optical amplifier, comprising: a laser diode generating and radiating a laser light for a Raman optical amplification; a wavelength division multiplexer passing an incident signal light and radiating a laser light radiated from the laser diode in a reverse direction of the incident signal light; a plurality of gain clamped semiconductor optical amplifiers of different gain bands amplifying an optical signal radiated from the wavelength division multiplexer; and a wavelength band divider coupling the plurality of the gain clamped semiconductor optical amplifier in parallel to perform an amplification according to different wavelength bands.

The present invention further provides a hybrid optical amplifier coupling a Raman fiber amplifier and a semiconductor optical amplifier, comprising: a laser diode chip generating and radiating a laser for a Raman optical amplification; a wavelength division multiplexer passing an incident signal light and radiating a laser light radiated from the laser diode in a reverse direction of the incident signal light; and a semiconductor optical amplification chip directly coupled without using an optical fiber to amplify an optical signal radiated from the wavelength division multiplexer, wherein the laser diode chip, the wavelength division multiplexer and the semiconductor optical amplification chip are packaged into one.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

Figure 1:
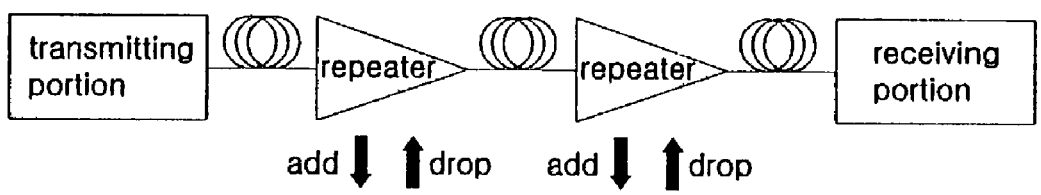
FIG. 1 is a block diagram illustrating a WDM optical transmission system having an add/drop of channels.
Figure 2:
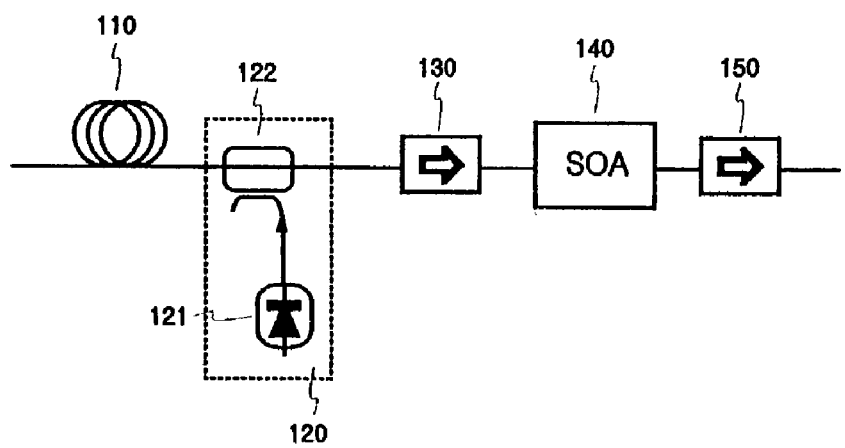
FIG. 2 is a block diagram illustrating a conventional hybrid type optical amplifier coupling a SOA and a RFA.
Figure 3:
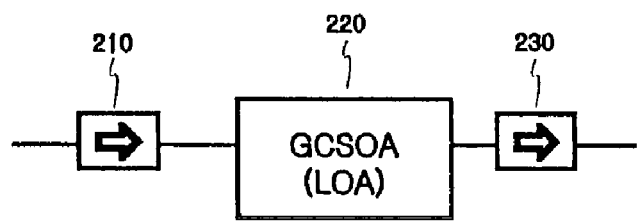
FIG. 3 is a block diagram illustrating a conventional gain clamped semiconductor optical amplifier.
Figure 4:
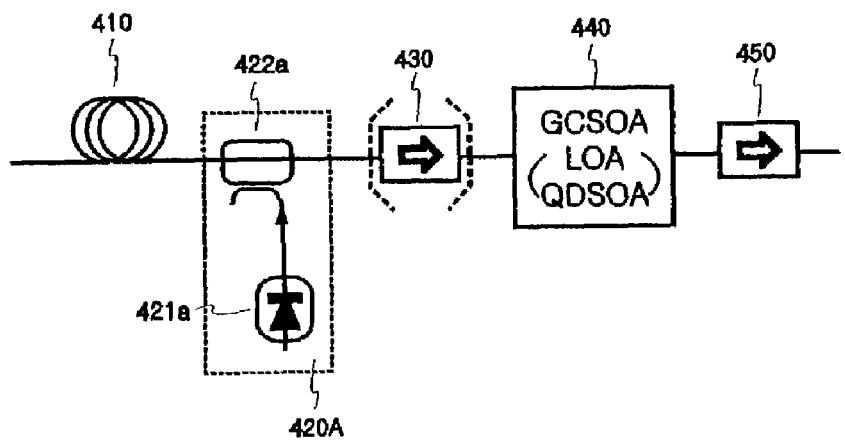
FIG. 4 is a block diagram illustrating a hybrid optical amplifier which couples a Raman fiber amplifier and a gain clamped semiconductor optical amplifier according to a first embodiment of the present invention.

FIG. 4 is a block diagram illustrating a hybrid optical amplifier that couples a Raman fiber amplifier and a gain clamped semiconductor optical amplifier according to a first embodiment of the present invention.

As shown in FIG. 4, the hybrid optical amplifier includes a transmission optical fiber 410, an Raman amplification laser diode 421a, a wavelength division multiplexer 422a which passes an incident signal light and radiates a laser light from the Raman amplification laser diode 421a in a reverse direction of the incident signal light, an isolator 430 which isolates a Raman optical amplifying portion 420A from a gain clamped semiconductor optical amplifier 440, and the gain clamped semiconductor optical amplifier 440 which amplifies a optical signal passing through the isolator 430. Therefore, an optical signal incident to the transmission optical fiber 410 is radiated to the isolator 430 through the wavelength division multiplexer 422a.

At this time, a laser light generated from the Raman optical amplification laser diode 421a is incident to the wavelength division multiplexer 422a and so radiates in a reverse direction of the incident signal light. The optical signal incident through the wavelength division muiltiplexer 422a is input to the gain clamped semiconductor optical amplifier 440. The isolator 430 prevent a backward propagating light from the gain clamped semiconductor optical amplifier 430 to isolate the Raman fiber amplifier 420A and the gain clamped semiconductor optical amplifying portion 440 from each other. The optical signal amplified by the gain clamped semiconductor optical amplifier 440 is output through a second isolator 450.

Therefore, the hybrid optical amplifier according to the present invention increases a gain and effective output of the gain clamped semiconductor optical amplifier, and lowers an effective noise figure by using a Raman gain, thereby operating as a gain clamped optical amplifier having an excellent performance. Further, the hybrid optical amplifier according to the present invention is convenient to use and low in price as a gain clamped optical amplifier because it can be packaged in a similar size to the existing communication laser while having various functions.

Figure 5:
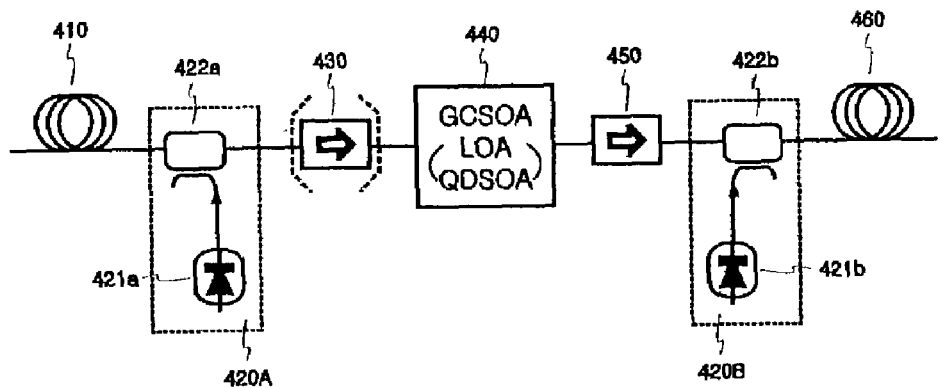
FIG. 5 is a block diagram illustrating a hybrid optical amplifier coupling a Raman fiber amplifier and a gain clamped semiconductor optical amplifier according to a second embodiment of the present invention.

FIG. 5 is a block diagram illustrating a hybrid optical amplifier coupling a Raman fiber amplifier and a gain clamped semiconductor optical amplifier according to a second embodiment of the present invention. The hybrid optical amplifier of FIG. 5 includes a Raman optical amplifying portion 420B and a transmission optical fiber 460 additionally arranged to a rear portion of the hybrid optical amplifier of FIG. 4, and has a configuration in which the optical signal is amplified through the gain clamped semiconductor optical amplifier 440 and becomes incident through the second isolator 450 and is Raman-amplified once more.

Therefore, whereas the output of the gain clamped semiconductor optical amplifier is restricted (a currently available product outputs about 10 dBm) and so a transmission is difficult when either a long distance transmission or a high output is required, the hybrid optical amplifier of FIG. 5 can perform an additional amplification of more than 5 dB using the relatively low Raman amplification laser diode and thus is suitable for a high output optical transmission or a long distance transmission.

Figure 6:
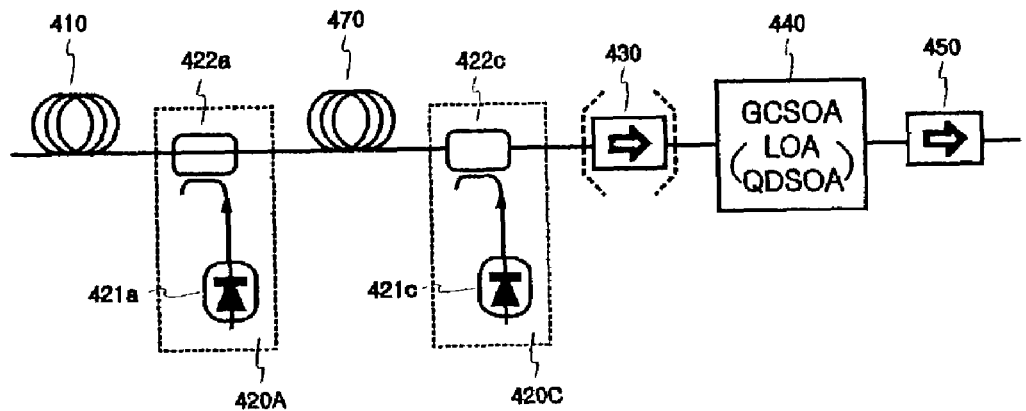
FIG. 6 is a block diagram illustrating a hybrid optical amplifier coupling a Raman fiber amplifier and a gain clamped semiconductor optical amplifier according to a third embodiment of the present invention.

FIG. 6 is a block diagram illustrating a hybrid optical amplifier coupling a Raman fiber amplifier and a gain clamped semiconductor optical amplifier according to a third embodiment of the present invention. The hybrid optical amplifier of FIG. 6 is a structure that inserts a dispersion compensating fiber (DCF) 470 to compensate a chromatic dispersion of a digital signal accumulated while the optical signal passes through the transmission optical fiber. Additional loss comes from the DCF, components for add/drop of channels, or a variable attenuator. At this time, the loss is compensated by Raman-amplifying the DCF 470 in a forward or reverse direction. Additional gain can be obtained by supplying a higher pump power if needed. In this case, a signal amplification following the DCF 470 is the same as performed in the hybrid optical amplifier of FIG. 4.

Figure 7:
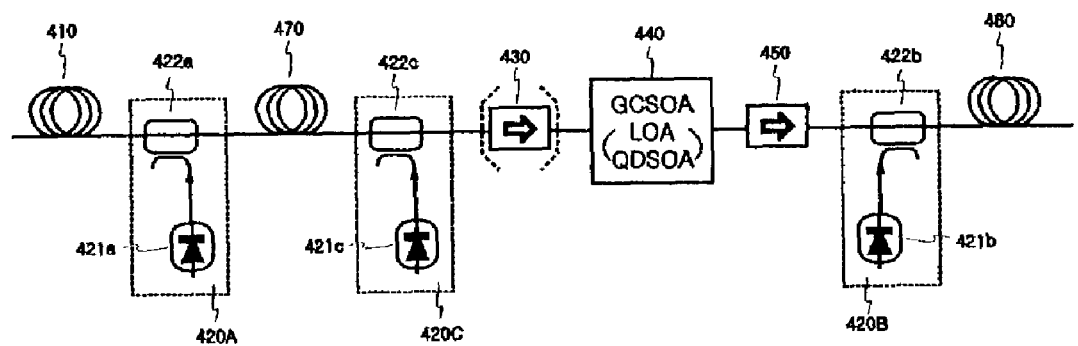
FIG. 7 is a block diagram illustrating a hybrid optical amplifier coupling a Raman fiber amplifier and a gain clamped semiconductor optical amplifier according to a fourth embodiment of the present invention.

FIG. 7 is a block diagram illustrating a hybrid optical amplifier coupling a Raman fiber amplifier and a gain clamped semiconductor optical amplifier according to a fourth embodiment of the present invention. The hybrid optical amplifier of FIG. 7 has a structure that Raman-amplifies a signal light output from a structure of FIG. 6 once more. The hybrid optical amplifier of FIG. 7 can Raman-amplify an output of a gain clamped semiconductor optical amplifier which is restricted to be relatively low by more than 5 dB by the relatively low Raman amplification laser diode, and thus can perfectly maintain a gain clamped characteristic and is suitable for a high output optical transmission system or a long distance transmission.

Meanwhile, in case of a gain clamped semiconductor optical amplifier, a gain variation according to a wavelength is smooth and small, but a gain difference of about 1 dB usually exists in a band of more than 30 nm. In order to offset this, a simple gain flattening filter can be used, and as a result, a gain clamped, gain flattening semiconductor optical amplification module having a very small gain difference can be manufactured. The gain flattening filter can be arranged at the front or rear portion of the gain clamped semiconductor optical amplifier according to the purpose.

Figure 8:
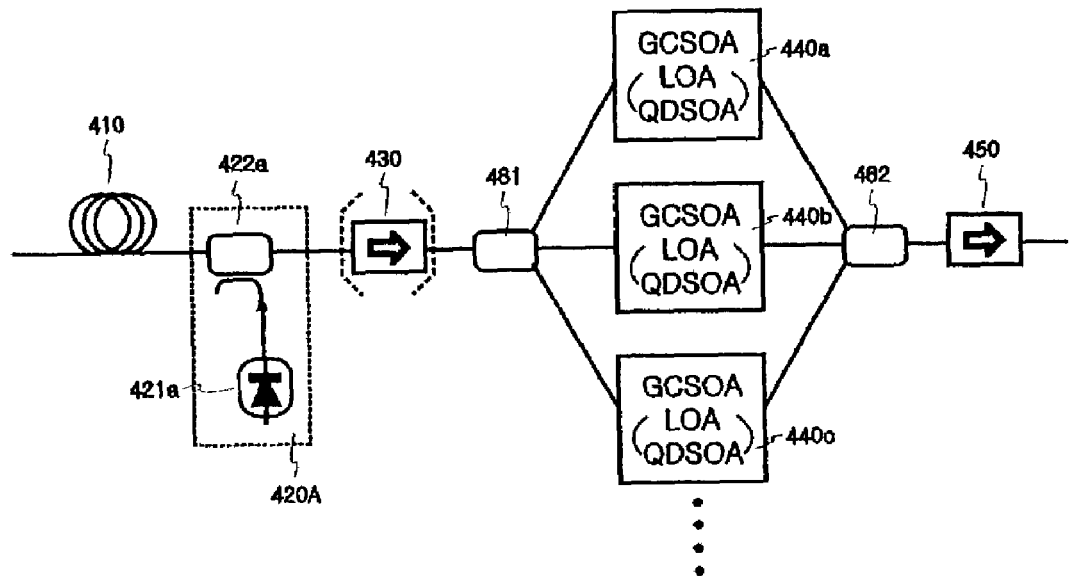
FIG. 8 is a block diagram illustrating a hybrid coupling a Raman fiber amplifier and a gain clamped semiconductor optical amplifier according to a fifth embodiment of the present invention.

FIG. 8 is a block diagram illustrating a hybrid optical amplifier coupling a Raman fiber amplifier and a gain clamped semiconductor optical amplifier according to a fifth embodiment of the present invention. In FIG. 8, a plurality of gain clamped semiconductor optical amplifiers having different gain bands are coupled in parallel to increase an amplification band and output power. At this time, a WDM optical signal coming after a Raman amplification is divided by a wavelength band divider 481 and is amplified by the corresponding one of gain clamped semiconductor optical amplifiers 440a to 440c. Thereafter, the amplified optical signal is collected using the wavelength band divider 482 and then is output through one optical fiber. In this case, an effect to increase an output intensity by the number of the gain clamped semiconductor optical amplifiers used and an effect to increase the bandwidth can be obtained at the same time. Further, several Raman amplification pumps are coupled to match a band of the gain clamped semiconductor optical amplifier. Raman amplification can be performed once more. The hybrid optical amplifiers of FIGS. 4 to 7 can be modified based on a parallel type of the fifth embodiment of the present invention.

Figure 9:
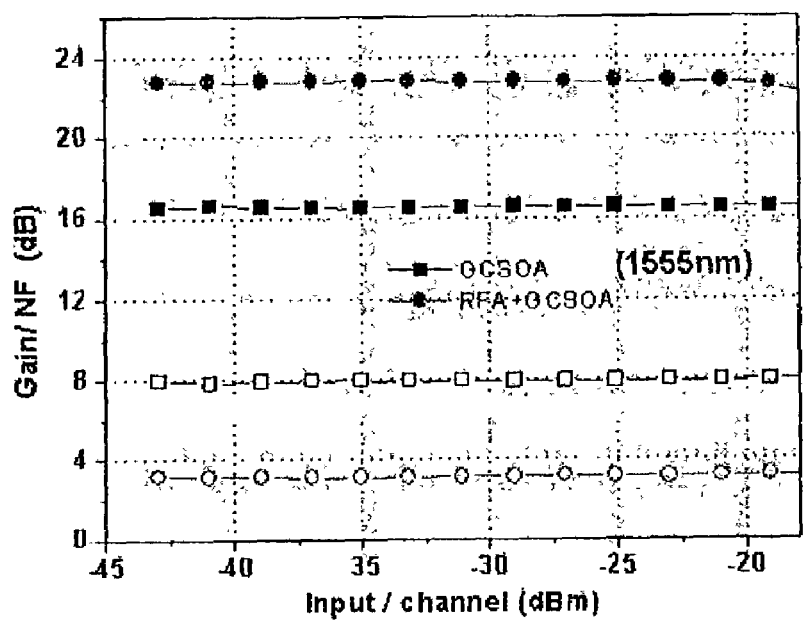
FIG. 9 is a graph illustrating a characteristic of the hybrid optical amplifier coupling the Raman fiber amplifier and the gain clamped semiconductor optical amplifier according to an embodiment of the present invention.

FIG. 9 is a graph illustrating a characteristic of the hybrid optical amplifier coupling the Raman fiber amplifier and the gain clamped semiconductor optical amplifier according to an embodiment of the present invention. In the graph of FIG. 9, a horizontal axis denotes an input light intensity per channel [dBm], and a vertical axis denotes a gain/noise figure [dB]. When the hybrid optical amplifier is used as a repeater to transmit a optical signal of 16 channels to 400 km at an 80 km interval, an optical signal to noise ratio is still good after 400 km and the resultant Q factor is 16.7 dB which corresponds to a bit error rate of 4.times.10.sup.−12. That is, it is understood that there is no problem in transmission.

In FIG. 9, .box-solid. denotes a gain value of the gain clamped semiconductor optical amplifier, .quadrature. denotes a noise figure of the gain clamped semiconductor optical amplifier, .circle-solid. denotes a gain value of the Raman fiber amplifier+the gain clamped semiconductor optical amplifier, and .smallcircle. denotes a noise figure of the Raman fiber amplifier+the gain clamped semiconductor optical amplifier.

A signal amplification characteristic of the hybrid optical amplifier of FIG. 4 is compared to that of the semiconductor optical amplifier alone. The gain and noise figure of the hybrid optical amplifier of FIG. 4 are 23 dB and 3 dB, respectively. In other words, the hybrid optical amplifier according to the present invention shows a much improved performance in gain and noise figure compared to the gain clamped semiconductor optical amplifier.

Meanwhile, a semiconductor quantum dot optical amplifier that recently undergoes many researches has a characteristic that a gain variation and a transient phenomenon do not occur and a gain flattening is maintained even though a signal passes through an optical amplifier several times.

When the gain clamped semiconductor optical amplifier is replaced with the semiconductor quantum dot optical amplifier in the inventive hybrid optical amplifier, a good characteristic is shown in the WDM network in which the number of channels is dynamically varied. The final output is almost constant over the whole channels even though an interval between the amplification is different. A gain clamping characteristic can be more strengthened by providing a feedback in the quantum dot optical amplifier.

Further, according to a use condition, an isolator can be added and removed, and a tap optical fiber terminal can be added to monitor an input/output signal.

As other embodiments of the present invention, an optical amplification gain value and a bandwidth can be increased using a plurality of Raman amplification laser diodes of different wavelengths. For example, a laser light from at least two Raman optical amplification laser diodes of different wavelengths is put in one optical fiber using a wavelength division multiplexer (not shown) or a polarization beam combiner to be sent to the wavelength division multiplexer to thereby increase an optical amplification gain value and a bandwidth.

Figure 10:
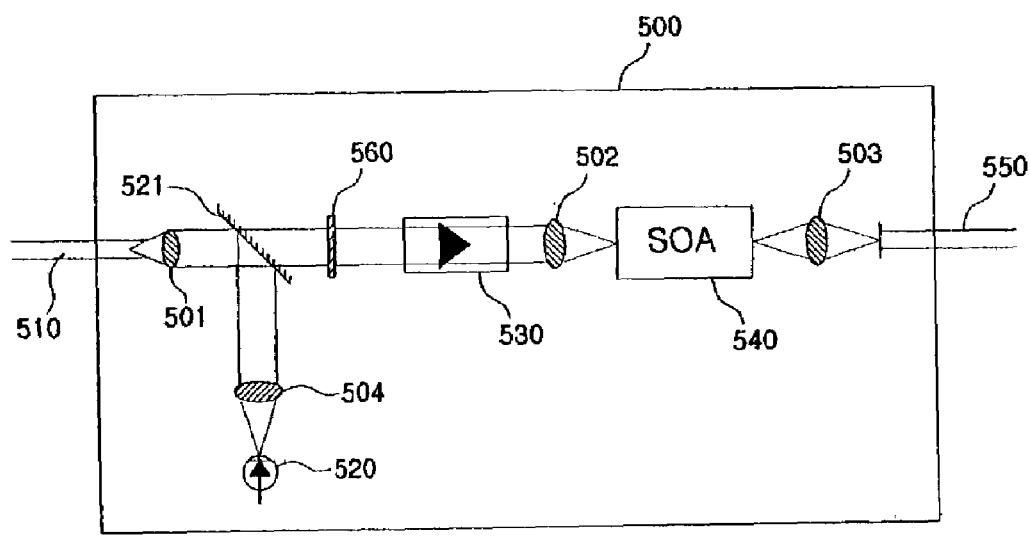
FIG. 10 is a block diagram illustrating a hybrid optical amplifier coupling a Raman fiber amplifier and a semiconductor optical amplifier according to a sixth embodiment of the present invention.

FIG. 10 is a block diagram illustrating a hybrid optical amplifier coupling a Raman fiber amplifier and a semiconductor optical amplifier according to a sixth embodiment of the present invention. The hybrid optical amplifier of FIG. 10 includes, as one package, transmission optical fibers 510 and 550, a Raman optical amplification laser diode 520, a dichroic mirror 521 which passes an incident signal light passing through a first lens 501 and radiates a laser light from the Raman optical amplification laser diode chip 520 in a reverse direction of the incident signal light, an isolator which isolates the Raman optical amplifying portion and the semiconductor optical amplifying portion, a semiconductor optical amplification chip which amplifies a optical signal passing through the isolator 530, a second lens which radiates the laser light generated from the Raman optical amplification laser diode chip 520 to the dichroic mirror 521, a third lens which collects an optical signal transmitted from the isolator 530 and radiates the optical signal to semiconductor optical amplification chip 540, and a fourth lens 503 which collect a signal light output from the semiconductor optical amplification chip 540 to be input to the optical fiber.

Here, a laser light for a Raman optical amplification supplied to the dichroic mirror 521 is supplied from the Raman optical amplification laser diode 520 in the packaged hybrid optical amplifier 500 or from an external portion.

The hybrid optical amplifier 500 packages the first to fourth lenses 501 to 504, the laser diode 520, the dichroic mirror 521, the isolator 530, and the semiconductor optical amplification chip 540 into one, and amplifies a optical signal incident through the optical fibers 510 and 550 connected to input/output terminals thereof.

The optical signal incident to the packaged hybrid optical amplifier 500 as described above becomes incident to the isolator 530 through the first lens 501 and the dichroic mirror 521. At this time, a laser light generated in the Raman optical amplification laser diode chip 520 becomes incident to the dichroic mirror 521 through the second lens 504 and is radiated in a reverse direction of the incident signal light. The optical signal incident to the isolator 530 through the dichroic mirror 521 is input to the semiconductor optical amplifier 540 through the third lens 502. The isolator 530 prevents a backward propagating light from the semiconductor optical amplifier 540 to isolate the Raman optical amplifying portion from the semiconductor optical amplifying portion. The optical signal amplified through the semiconductor optical amplifier 540 is output to the optical fiber 550 connected to the hybrid optical amplifier 500 through the fourth lens 503.

An optical signal is directly radiated without using the optical fiber to be transmitted between the first lens 501 and the dichroic mirror 521, between the second lens 504 and the dichroic mirror 521, between the dichroic mirror 521 and the isolator 530, and between the isolator 530 and the third lens 502.

Further, the Raman optical amplification laser diode chip 520 is built in the hybrid optical amplifier 500 to provide a Raman optical signal, or the Raman optical signal is provided externally.

An optical amplification module having an excellent performance can be achieved in the WDM network in which the number of channel can be varied when the existing semiconductor optical amplifier is replaced with the gain clamped semiconductor optical amplification chip or the semiconductor quantum dot optical amplification chip which are used in the first to fifth embodiments of the present invention.

Further, according to a use condition, the isolator can be added or removed, and a tap optical fiber terminal can be added to monitor an input/output signal.

The Raman optical amplification laser light can be supplied from the outside of the hybrid optical amplifier 500 by coupling device. In this case, a laser light radiated from an end of a third optical fiber which is to be located in the position of the Raman amplification laser diode chip 520 will be collected by the second lens 504.

As another embodiment of the present invention, an optical amplification gain value and a bandwidth can be increased using a plurality of Raman optical amplification laser diode chip of different gain bands. For example, two laser lights radiated from two Raman optical amplification laser diode chips of different gain bands is coupled into one parallel light using the dichroic mirror (not shown) and thereafter is transferred to a dichroic mirror 521, thereby increasing an optical amplification gain value and a bandwidth.

As another embodiment of the present invention, a gain flattening filter 560 can be arranged between the dichroic mirror 521 and the second lens 502 or between the third lens 503 and the transmission optical fiber 550 to have an addition gain flattening.

As another embodiment of the present invention, the DCF can be arranged between the wavelength division multiplexer 521 and the semiconductor optical amplifier 540 to compensate an accumulated chromatic dispersion of an optical signal. In this case, two lenses, one for collecting the parallel signal light into the DCF, the other for collimating the light from the DCF are added. To compensate the loss due to the insertion of the DCF, a Raman amplifying means can be coupled to a rear and/or a front portions of the DCF.

As another embodiment of the present invention, the DCF to compensate an accumulated chromatic dispersion of an optical signal can be arranged outside the packaged hybrid optical amplifier, thereby compensating the chromatic dispersion of a digital signal.

As described herein before, the optical amplification system coupling the Raman fiber amplifier and the semiconductor optical amplifier increases an output and performance, lowers a noise figure, and can clamp a gain by the gain clamped semiconductor optical amplifier even though the number of channels is varied. Also, by adjusting the energy gap of the semiconductor, a gain band of the semiconductor optical amplifier is easily changed, and a Raman amplification band can be easily changed by changing the wavelength of the pump laser diode. As a result, the hybrid optical amplifier of the present invention can have good gain characteristics in a band in which the conventional EDFA or the rare-earth doped fiber amplifier cannot amplify the signal. When the more communication capacity is required, an optical amplifier of excellent characteristics can be easily achieved in a new band with the present invention.

Further, by packaging a semiconductor optical amplifier chip and a Raman amplification laser chip into one small component, a manufacturing cost can be greatly lowered and a size can be reduced significantly.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A hybrid optical amplifier coupling a Raman fiber amplifier and a semiconductor optical amplifier, comprising:
   a laser diode generating and radiating a laser light for a Raman optical amplification;
   a wavelength division multiplexer passing an incident signal light and radiating the laser light radiated from the laser diode in a reverse direction of the incident signal light; and
   a gain clamped semiconductor optical amplifier amplifying an optical signal radiated from the wavelength division multiplexer;
   a dispersion compensated fiber coupled to at least one of a rear portion of the wavelength division multiplexer and a front portion of the wavelength division multiplexer to compensate an accumulated chromatic dispersion of an optical signal; and
   a Raman amplifying means coupled to at least one of a rear portion of the dispersion compensated fiber and a front portion of the dispersion compensated fiber.

2. The hybrid optical amplifier of claim 1, wherein the gain clamped semiconductor optical amplifier is a semiconductor amplifier which clamps a gain through a feedback.

3. The hybrid optical amplifier of claim 1, wherein the gain clamped semiconductor optical amplifier is a semiconductor quantum dot optical amplifier.

4. The hybrid optical amplifier of claim 1, further comprising, a Raman amplifying means arranged at a rear portion of the gain clamped semiconductor optical amplifier.

5. The hybrid optical amplifier of claim 1, further comprising, a tap optical fiber terminal arranged at at least one of:
   (a) an input terminal of the hybrid optical amplifier to monitor an input signal, and
   (b) an output terminal of the hybrid optical amplifier to monitor an output signal.

6. The hybrid optical amplifier of claim 1, further comprising, an isolator arranged at at least one of a front portion and a rear portion of the gain clamped semiconductor optical amplifier to block reflected light.

7. A hybrid optical amplifier coupling a Raman fiber amplifier and a semiconductor optical amplifier comprising,
   a laser diode generating and radiating a laser light for a Raman optical amplification;
   a wavelength division multiplexer (WDM) passing an incident signal light and radiating the laser light radiated from the laser diode in a reverse direction of the incident signal light;
   a gain clamped semiconductor optical amplifier amplifying an optical signal radiated from the WDM;
   a dispersion compensated fiber (DCF) coupled to a rear portion of the wavelength division multiplexer to compensate an accumulated chromatic dispersion of an optical signal;
   a Raman amplifying means coupled to at least one of a front portion and a rear portion of the dispersion compensated fiber; and
   a Raman amplifying means arranged at a rear portion of the gain clamped semiconductor optical amplifier.

8. The hybrid optical amplifier of claim 7, further comprising, a tap optical fiber terminal arranged at at least one of:
   (a) an input terminal of the hybrid optical amplifier to monitor an input signal, and
   (b) an output terminal of the hybrid optical amplifier to monitor an output signal.

9. A hybrid optical amplifier coupling a Raman fiber amplifier and a semiconductor optical amplifier comprising,
   a laser diode generating and radiating a laser light for a Raman optical amplification;
   a wavelength division multiplexer (WDM) passing an incident signal light and radiating the laser light radiated from the laser diode in a reverse direction of the incident signal light;
   a gain clamped semiconductor optical amplifier amplifying an optical signal radiated from the WDM; and
   a gain flattening filter arranged at least one of a front portion and a rear portion of the gain clamped semiconductor optical amplifier to further flatten the gain spectrum.

10. A hybrid optical amplifier coupling a Raman fiber amplifier and a semiconductor optical amplifier, comprising:
    a laser diode generating and radiating a laser light for a Raman optical amplification;
    a wavelength division multiplexer passing an incident signal light and radiating the laser light radiated from the laser diode in a reverse direction of the incident signal light;
    a wavelength band divider coupling a plurality of the gain clamped semiconductor optical amplifier in parallel to perform an amplification according to different wavelength bands;
    a plurality of gain clamped semiconductor optical amplifiers of different gain bands amplifying an optical signal radiated from the wavelength division multiplexer; and
    a wavelength band combiner coupling the signals amplified at each gain clamped semiconductor optical amplifier into one optical fiber.

11. The hybrid optical amplifier of claim 10, wherein the gain clamped semiconductor optical amplifiers are semiconductor amplifiers which clamp a gain through a feedback.

12. The hybrid optical amplifier of claim 10, wherein the gain clamped semiconductor optical amplifiers are semiconductor quantum dot optical amplifiers.

13. The hybrid optical amplifier of claim 10, further comprising, Raman amplifying means arranged at rear portions of the gain clamped semiconductor optical amplifiers.

14. The hybrid optical amplifier of claim 13, further comprising,
    a tap optical fiber terminal arranged at at east one of:
       (a) an input terminal of the hybrid optical amplifier to monitor an input signal, and
       (b) an output terminal of the hybrid optical amplifier to monitor an output signal.

15. The hybrid optical amplifier of claim 10, further comprising, a dispersion compensated fiber (DCF) coupled to a rear portion of the wavelength division multiplexer to compensate an accumulated chromatic dispersion of an optical signal; and a Raman amplifying means coupled to at least one of a rear portion and a front portion of the DCF.

16. The hybrid optical amplifier of claim 10, further comprising,
    a dispersion compensated fiber (DCF) coupled to a rear portion of the wavelength division multiplexer to compensate an accumulated chromatic dispersion of an optical signal;
    a Raman amplifying means coupled to a front and/rear portions of the dispersion compensated fiber; and
    a Raman amplifying means arranged at a rear portion of the gain clamped semiconductor optical amplifier.

17. The hybrid optical amplifier of claim 16, further comprising, a tap optical fiber terminal arranged at at least one of:
  (a) an input terminal of the hybrid optical amplifier to monitor an input signal, and
  (b) an output terminal of the hybrid optical amplifier to monitor an output signal.

18. The hybrid optical amplifier of claim 10, further comprising, an isolator arranged at at least one of a front portion and a rear portion of the gain clamped semiconductor optical amplifier to block the reflected light.

19. The hybrid optical amplifier of claim 10, further comprising, a gain flattening filter arranged at a front and/or rear portions of the gain clamped semiconductor optical amplifier to further flatten the gain spectrum.

20. A hybrid optical amplifier coupling a Raman fiber amplifier and a semiconductor optical amplifier, comprising:
  a laser diode chip generating and radiating a laser light for a Raman optical amplification;
  a wavelength division multiplexer passing an incident signal light and radiating the laser light radiated from the laser diode in a reverse direction of the incident signal light; and
  a semiconductor optical amplification chip directly coupled without using an optical fiber to amplify an optical radiated from the wavelength division multiplexer, wherein the laser diode chip, the wavelength division multiplexer and the semiconductor optical amplification chip are packaged into one.

21. The hybrid optical amplifier of claim 20, wherein the wavelength division multiplexer is a dichroic mirror which passes an incident signal light and reflects a laser light radiated from the laser diode chip in a reverse direction of the incident signal light.

22. The hybrid optical amplifier of claim 20, wherein the semiconductor optical amplification chip is one of a gain clamped semiconductor optical amplification chip or a semiconductor quantum dot optical amplification chip.

23. The hybrid optical amplifier of claim 20, further comprising,
  a first lens transforming the incident optical signal into a parallel light;
  a second lens transforming a laser radiated from the laser diode chip to a parallel light; and
  third and fourth lenses collecting at least one of:
    (a) an optical signal input to a front portion of the semiconductor optical amplification chip, and
    (b) an optical signal output from a rear portion of the semiconductor optical amplification chip.

24. The hybrid optical amplifier of claim 20, further comprising, at least one isolator preventing a backward propagating light at least one of:
  (a) from the semiconductor optical amplification chip, and
  (b) to the semiconductor optical amplification chip.

25. The hybrid optical amplifier of claim 20, wherein the laser diode is arranged outside the packaged hybrid optical amplifier.

26. The hybrid optical amplifier of claim 20, further comprising,
  at least one laser diode chip to generate a laser light of a wavelength different from the above mentioned laser diode chip; and
  a dichroic mirror transforming an optical signal generated from the respective laser diodes into one parallel light to be radiated to the wavelength division multiplexer.

27. The hybrid optical amplifier of claim 20, further comprising, a tap optical fiber terminal arranged at at least one of:
  (a) an input terminal of the packaged hybrid optical amplifier to monitor an input signal, and
  (b) and an output terminal of the packaged hybrid optical amplifier to monitor an output signal.

28. The hybrid optical amplifier of claim 20, further comprising, a gain flattening filter arranged between the wavelength division multiplexer and the semiconductor optical amplification chip.

29. The hybrid optical amplifier of claim 20, further comprising, a gain flattening filter arranged at a rear portion of the semiconductor optical amplification chip.

30. The hybrid optical amplifier of claim 20, further comprising, a Raman amplifying means arranged at a rear portion of the semiconductor optical amplification chip.

31. The hybrid optical amplifier of claim 20, further comprising, a dispersion compensated fiber (DCF) for compensating an accumulated chromatic dispersion of an optical signal and being arranged between the wavelength division multiplexer and the semiconductor optical amplifier; and a Raman amplifying means coupled to at least one of a rear portion and a front portion of the dispersion compensated fiber.

32. The hybrid optical amplifier of claim 20, further comprising, a dispersion compensated fiber (DCF) to compensate an accumulated chromatic dispersion of an optical signal is arranged outside the packaged hybrid optical amplifier.

33. The hybrid optical amplifier of claim 31, wherein the gain flattening filter is arranged between the wavelength division multiplexer and the semiconductor optical amplification chip, between the semiconductor optical amplification chip and the Raman amplifying means arranged at a rear portion of the semiconductor optical amplification chip, or between the Raman amplifying means arranged at a rear portion of the semiconductor optical amplification chip and the lens.

34. The hybrid optical amplifier of claim 32, wherein the gain flattening filter is arranged between the wavelength division multiplexer and the semiconductor optical amplification chip, between the semiconductor optical amplification chip and the Raman amplifying means arranged at a rear portion of the semiconductor optical amplification chip, or between the Raman amplifying means arranged at a rear portion of the semiconductor optical amplification chip and the lens.

35. The hybrid optical amplifier of claim 31, further comprising, a Raman amplifying means arranged at a rear portion of the semiconductor optical amplification chip.

36. The hybrid optical amplifier of claim 32, further comprising, a Raman amplifying means arranged at a rear portion of the semiconductor optical amplification chip.

* * * * *